US009071218B2

(12) United States Patent
Verchykov

(10) Patent No.: US 9,071,218 B2
(45) Date of Patent: Jun. 30, 2015

(54) ELECTRONIC DEVICE AUDIO VOLUME REDUCTION IN RESPONSE TO AUDIO COMMUNICATION REQUEST

(75) Inventor: Roman Verchykov, Kharkov (UA)

(73) Assignee: EchoStar Ukraine LLC, Kharkiv (UA)

( * ) Notice: Subject to any disclaimer, the term of this patent is extended or adjusted under 35 U.S.C. 154(b) by 124 days.

(21) Appl. No.: 13/578,400

(22) PCT Filed: Feb. 23, 2010

(86) PCT No.: PCT/UA2010/000006

§ 371 (c)(1), (2), (4) Date: Aug. 10, 2012

(87) PCT Pub. No.: WO2011/105980

PCT Pub. Date: Sep. 1, 2011

(65) Prior Publication Data

US 2012/0307150 A1 Dec. 6, 2012

(51) Int. Cl.

| | |
|---|---|
| ***H04N 7/00*** | (2011.01) |
| ***H03G 3/34*** | (2006.01) |
| ***H04N 21/41*** | (2011.01) |
| ***H04N 21/454*** | (2011.01) |
| ***H04N 21/485*** | (2011.01) |

(52) U.S. Cl.

CPC .......... *H03G 3/342* (2013.01); *H04N 21/4126* (2013.01); *H04N 21/454* (2013.01); *H04N 21/4852* (2013.01)

(58) Field of Classification Search

USPC .......... 379/102.03, 142.16, 93.23; 348/14.04, 348/552, 738, 729, 14.01, E5.002

See application file for complete search history.

(56) References Cited

U.S. PATENT DOCUMENTS

| | | | | |
|---|---|---|---|---|
| 2003/0142802 A1* | 7/2003 | Hong et al. | .............. | 379/102.03 |
| 2008/0141302 A1 | 6/2008 | Ota | | |
| 2009/0016540 A1 | 1/2009 | Nielsen et al. | | |
| 2009/0122131 A1* | 5/2009 | Mears | ........................ | 348/14.04 |

FOREIGN PATENT DOCUMENTS

WO 2005099244 A1 10/2005

* cited by examiner

*Primary Examiner* — Duc Nguyen
*Assistant Examiner* — Yosef K Laekemariam
(74) *Attorney, Agent, or Firm* — Lowe Graham Jones PLLC

(57) ABSTRACT

Presented is a method of facilitating use of an audio communication device, such as a telephone, in the presence of an electronic device capable of generating sound, such as a television or audio receiver. In the method, a message is received from the audio communication device, wherein the message indicates the audio communication device has received a request for an audio communication, such as a telephone call, from a second audio communication device. In response to receiving the message, an audio volume of the electronic device is reduced.

12 Claims, 5 Drawing Sheets

ENTERTAINMENT SYSTEM 300
INCOMING CALL REQUEST 310
MESSAGE 312
PHONE 308
PHONE 306
TELEVISION SET-TOP BOX 301
TELEVISION 304
AUDIO 314A
DVD PLAYER 302
AUDIO RECEIVER 305
AUDIO 314B
AUDIO/ VIDEO CONTENT 320

ELECTRONIC DEVICE AUDIO VOLUME REDUCTION IN RESPONSE TO AUDIO COMMUNICATION REQUEST

PRIORITY CLAIM

This application is a §371 National Stage Application of International Application No. PCT/UA/2010/000006, filed Feb. 23, 2010, and entitled "ELECTRONIC DEVICE AUDIO VOLUME REDUCTION IN RESPONSE TO AUDIO COMMUNICATION REQUEST." Accordingly, the present application claims priority to and the benefit of the filing date of International Application No. PCT/UA/2010/000006, which is incorporated herein by reference in its entirety.

BACKGROUND

The typical household entertainment system provides users with media content, such as movies, television episodes, news programs, sporting events, and music of various genres. As a result, such a system normally presents both video and audio portions of the content for the user's enjoyment. With respect to the audio portion, the system may generate significant audio volume under the command of the user by way of an audio receiver with multiple attached speakers, or even by way of speakers incorporated in a television unit. During times of such high audio volume levels, the attention of the user is likely to be focused on the media content being presented by the entertainment system to the exclusion of nearly everything else that may require the attention of the user during that time.

BRIEF DESCRIPTION OF THE DRAWINGS

Many aspects of the present disclosure may be better understood with reference to the following drawings. The components in the drawings are not necessarily depicted to scale, as emphasis is instead placed upon clear illustration of the principles of the disclosure. Moreover, in the drawings, like reference numerals designate corresponding parts throughout the several views. Also, while several embodiments are described in connection with these drawings, the disclosure is not limited to the embodiments disclosed herein. On the contrary, the intent is to cover all alternatives, modifications, and equivalents.

DETAILED DESCRIPTION

The enclosed drawings and the following description depict specific embodiments of the invention to teach those skilled in the art how to make and use the best mode of the invention. For the purpose of teaching inventive principles, some conventional aspects have been simplified or omitted. Those skilled in the art will appreciate variations of these embodiments that fall within the scope of the invention. Those skilled in the art will also appreciate that the features described below can be combined in various ways to form multiple embodiments of the invention. As a result, the invention is not limited to the specific embodiments described below, but only by the claims and their equivalents.

Figure 1:
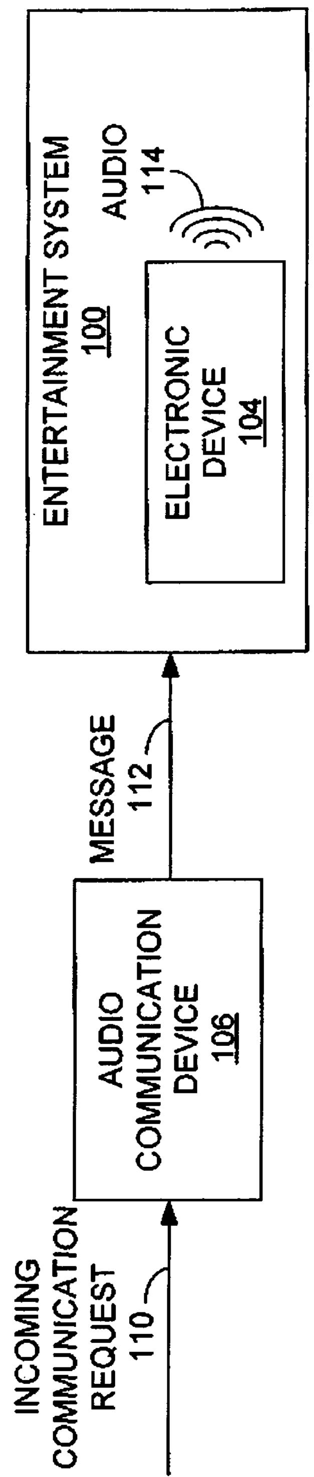
FIG. 1 is a simplified block diagram of an audio communication device communicatively coupled with an entertainment system according to an embodiment of the invention.

FIG. 1 depicts an audio communication device 106 communicatively coupled with an entertainment system 100 including at least one electronic device 104 capable of generating sound or audio 114. The audio communication 106 is a communication device that utilizes sound, such as speech, to communicate with another audio communication device. Examples of the audio communication device 106 include a cellular or wireless phone, a landline phone, and a computer configured to engage in Voice over IP (VoIP) calls with other audio communication devices. The electronic device 104 of FIG. 1 may be any device configured to generate sound or audio 114, such as a television or audio amplifier/receiver.

Figure 2:
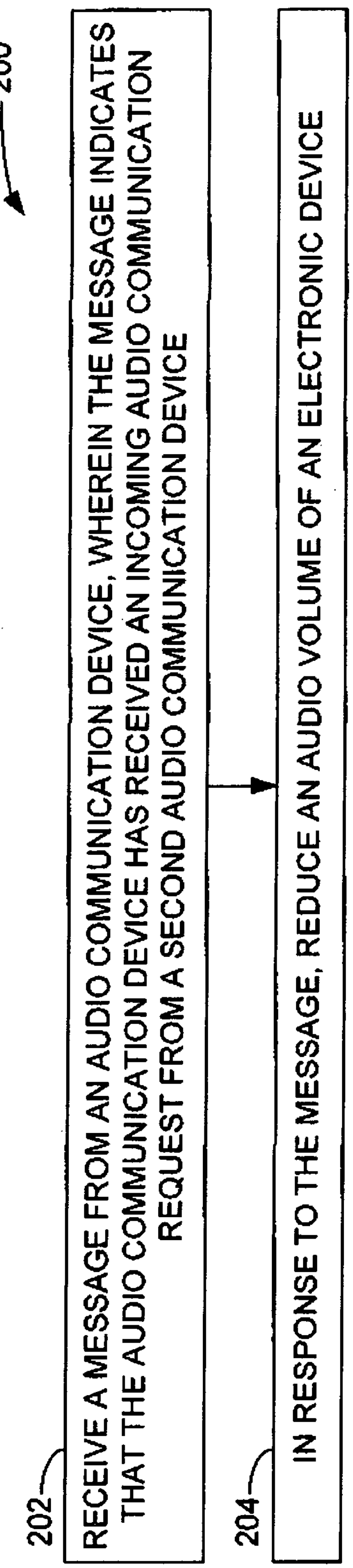
FIG. 2 is a flow diagram of a method according to an embodiment of facilitating use of an audio communication device in the presence of an electronic device capable of generating sound.

FIG. 2 presents a method 200 of facilitating use of the audio communication device 106 in the presence of the electronic device 104, such as when the electronic device 104 is generating audio 114. In the method 200, the entertainment system 100 receives a message 112 from the audio communication device 106 indicating that the audio communication device 106 has received an incoming audio communication request 110 from a second audio communication device (not shown in FIG. 1) (operation 202). An example of the request 110 is an incoming call from the second audio communication device. In response to the message 112, the volume of the audio 114 of the electronic device 104 is reduced (operation 204). Examples of reducing the volume may include muting the audio 114, pausing the media content of which the audio 114 is a part, and powering off the electronic device 104.

In another embodiment, a computer-readable storage medium may have encoded thereon instructions for a processor or other control circuitry of the electronic device 104, such as a television set-top box, or another device within the entertainment system 100, to implement the method 200.

As a result of employing the method 200, the volume level of audio generated by an entertainment system is lowered so that a sound notification, such as the audible ringing of a landline or cellular phone, of an incoming communication request may not be masked, thereby allowing a user to recognize the incoming communication and react as needed. Therefore, missed incoming communications involving audio notification to the user may be reduced or eliminated. Additional advantages may be recognized from the various implementations of the invention discussed in greater detail below.

Figure 3:
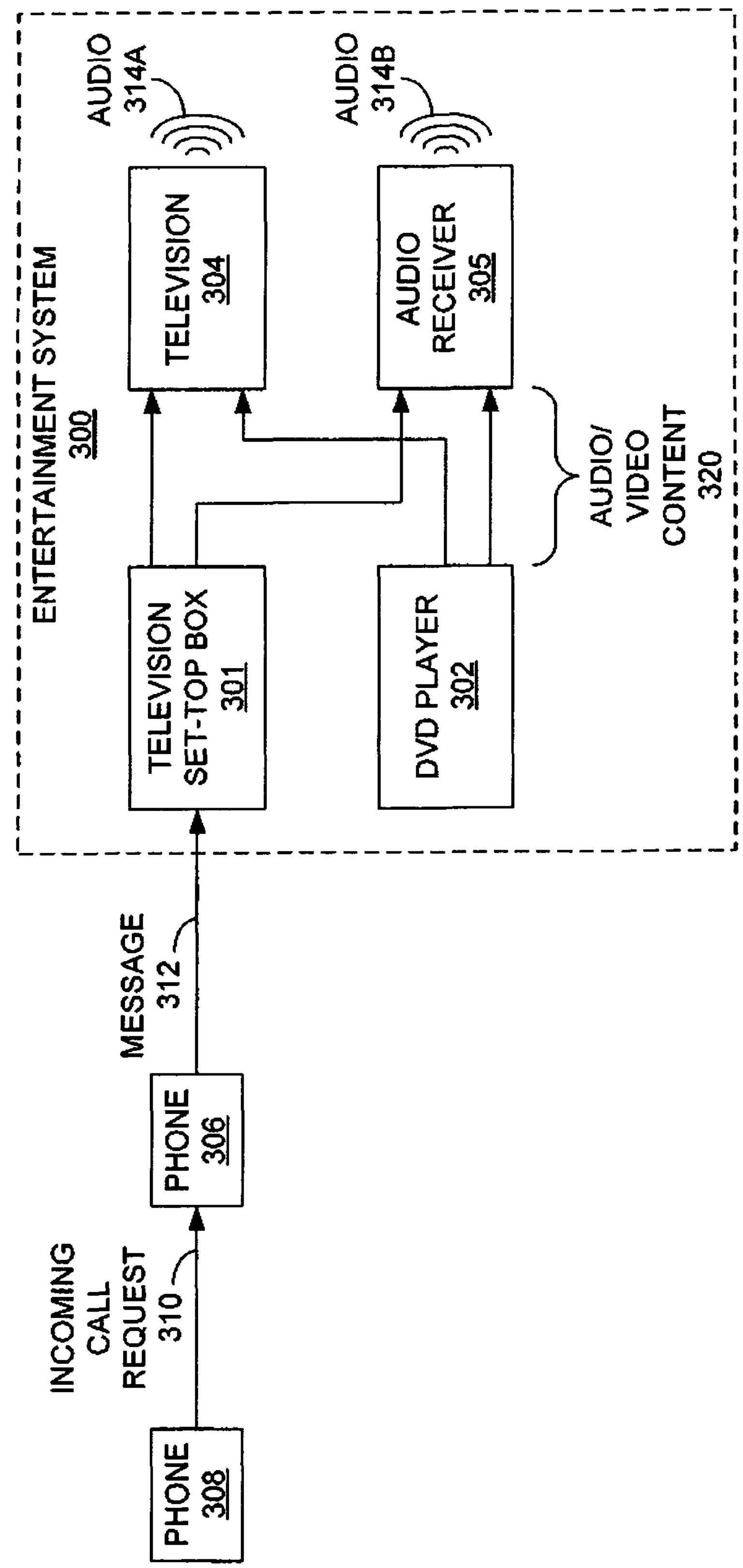
FIG. 3 is a block diagram of a telephone communicatively coupled with an entertainment system including a television set-top box according to an embodiment of the invention.

FIG. 3 is a simplified block diagram of a specific example of an audio communication device—a telephone 306—coupled with an entertainment system 300 including several electronic devices 301-305. More specifically, the entertainment system 300 includes a television set-top box 301, a digital versatile disc (DVD) player 302, a television 304, and an audio receiver 305. As shown, the set-top box 301 and the DVD player 302 provide audio and/or video content 320 to the television 304 and/or the audio receiver 305 for presentation or playback to a user. In other implementations, connections between the various devices 301-305 other than those depicted in FIG. 3, such as between the television 304 and the audio receiver 305, may also be present in other arrangements. Further, each of the television 304 and the audio receiver 305 may be generating audio 314 at any point in time for the consumption or enjoyment of the user. The audio/ video content 320 may be transported over any wired or wireless communication connection, such as a modulated RF connection, a composite or component video and associated audio connection, a High Definition Multimedia Interface (HDMI) connection, and a IEEE 802.11x (Wi-Fi) connection. In other implementations, more or fewer electronic devices may be included in the entertainment system 300.

In operation, as shown in FIG. 3, the telephone receives an incoming call request 310 from a second phone or similar audio communication device 308. The call may be attempted by way of a public switched telephone network (PSTN), via the Internet, or by way of some other communication network. In response, the telephone 306 issues a message 312 over a communication link to the television set-top box 301 of the entertainment system 300 to notify the set-top box 301 of the incoming call request 310. In response to the message 312, the set-top box 301 causes a reduction in the volume of the audio 314 generated by either or both of the television 304 and the 305. As is described in greater detail below, this reduction can be performed by the set-top box 301 reducing the audio 314 volume level of the content 320 being transferred to the television 304 and/or the audio receiver 305. In another example, the set-top box 301 may lessen the audio 314 volume by transmitting a command to either or both of the television 304 and the audio receiver 305 to cause the devices 304, 305 to reduce the volume of the audio 314.

Figure 4:
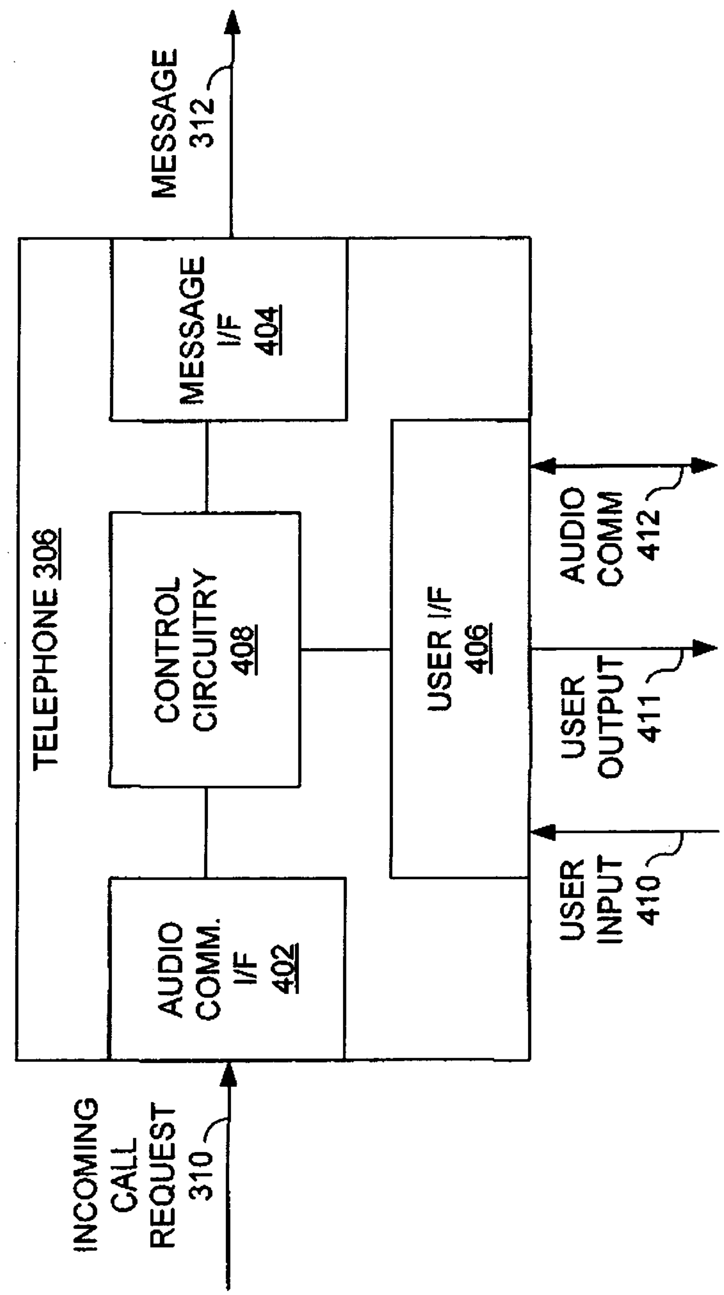
FIG. 4 is a block diagram of the telephone of FIG. 3 according to an embodiment of the invention.

A block diagram of the telephone 306 presented in FIG. 3 according to one embodiment is provided in FIG. 4. As shown, the telephone. 306 includes an audio communication interface 402, a message interface 404, a user interface 406, and control circuitry 408. Representations of other circuitry, such as a power supply, antenna, and the like, are not included in FIG. 4 to simplify the following discussion.

The audio communication interface 402 may be any wired or wireless communication interface configured to receive an incoming call. In the case of a landline telephone, the audio communication interface 402 may be a PSTN interface that includes a modular phone connection, an Ethernet or Wi-Fi interface for connection to the Internet via a Digital Subscriber Line (DSL) or cable modem (modulator-demodulator), a wireless interface with antenna to communicate with a cellular base transceiver station (BTS), or any other communication interface capable of transmitting and receiving audio communications.

The message interface 404 may be any wired or wireless interface capable of transmitting the message 312 to an electronic device that is typically located within the same premises as the telephone 306. Typical examples of the message interface 404 may include an Ethernet interface, a Wi-Fi interface, a Bluetooth® interface, or a home electrical power line interface, such as HomePlug®. Other types of communication links capable of carrying such a message within a particular building or residence may be utilized in other implementations.

The user interface 406 may be any interface employable by the user to enter commands, data, and other user input 410, such as a numeric keypad or touchscreen, as well as receive information, status, and other user output 411 from the telephone 306, such as a liquid crystal display (LCD). The user interface 406 also allows a user to communicate via the audio communication interface 402 with another audio communication device, such as the second telephone 308 depicted in FIG. 3, by way of speech or audio communication 412.

The control circuitry 408 may be configured to control and interact with each of the audio communication interface 402, the message interface 404, and the user interface 406. The control circuitry 408 may include one or more processors, such as a microprocessor, microcontroller, or digital signal processor (DSP), configured to execute instructions directing the processor to perform the functions mentioned herein. The control circuitry 408 may also include memory or data storage adapted to contain such instructions. Such memory may also include data to aid the control circuitry 408 in performing the tasks more particularly described below. In another implementation, the control circuitry 408 may be strictly hardware-based logic, or may include a combination of hardware, firmware, and/or software elements.

In operation, the control circuitry 408 receives an incoming call request 310 or other request for audio communication via the audio communication interface 402. In response, the control circuitry 408 generates and transmits the message 312 via the message interface 404 to indicate the reception of the request 310 to the set-top box 301 of FIG. 3. In one implementation, the message 312 need not include any substantive information. In other examples, the message 312 may include an identification or address of the telephone 306, such as telephone number, to allow the set-top box 301 to distinguish the telephone 306 from other telephones in the vicinity. The message 312 may include the identity or phone number of the second telephone 308 requesting the call with the first telephone 306 in other implementations.

Figure 5:
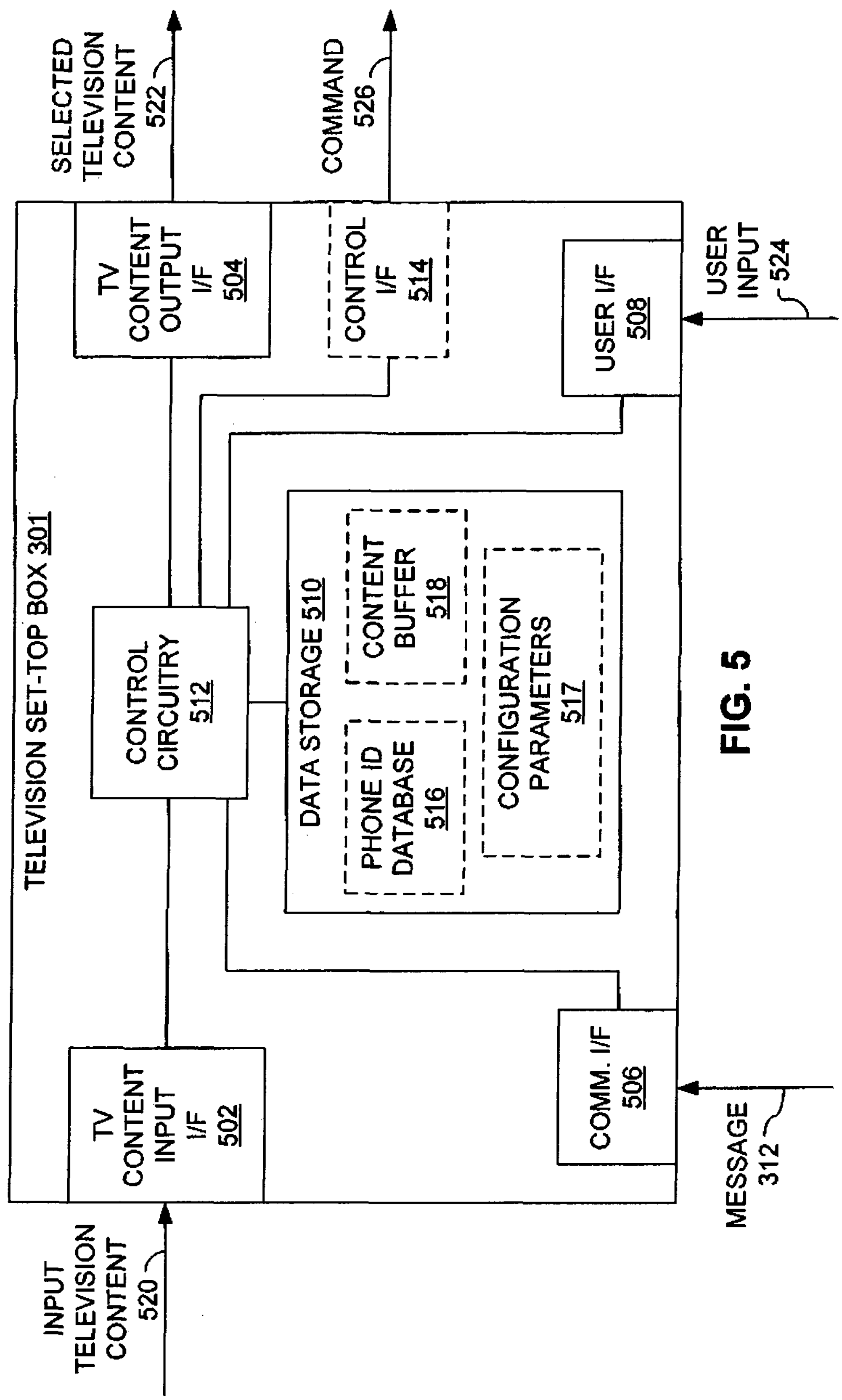
FIG. 5 is a block diagram of the television set-top box of FIG. 3 according to an embodiment of the invention.

FIG. 5 provides a block diagram of one example of the television set-top box 301. As illustrated in FIG. 5, the set-top box 301 may include a television content input interface 502, a television content output interface 504, a communication interface 506, and a user interface 508. Optionally, the set-top box 301 may further include data storage 510 and a control interface 514. Other conventional components often incorporated into a set-top box 301, such as a power supply, a "smart card" interface, and the like, may be included in the set-top box 301 but are not discussed further herein to focus the following discussion.

The television content input interface 502 receives input television content 520, a selection of which is to be presented to the user under the control of the user. The particular design or configuration of the television content input interface 502 depends primarily on the type or format of the input television content 520 to be received. For example, if the set-top box 301 is a satellite television set-top box 301, the television content input interface 502 may receive the input television content 520 via a parabolic antenna and a low-noise block-converter (LNB) (not illustrated in FIG. 5), which receives, down-converts, and forwards the signal to the television content input interface 502, typically via a coaxial cable. The television content input interface 502 may include one or more tuners allowing the user to select particular programming channels of the incoming content 520 for forwarding to the television 304 and/or the audio receiver 305. The television content input interface 502 may also perform any decryption, decoding, and similar processing of the received content 520 required to place the content 520 in a format usable by the television content output interface 504. In one example, such a format may be one of the Motion Picture Experts Group (MPEG) formats, such as MPEG-2 or MPEG-4, although other television content format standards may be utilized in other embodiments.

If, instead, the set-top box 301 is configured as a cable television set-top box, the television content input interface 502 may be configured to receive television programming from a cable head-end. If, instead, the set-top box 301 is a terrestrial television receiver, the television content input interface 502 may receive the input television content 520 via a terrestrial antenna receiving television signals "over the air".

The television content output interface 504 provides the selected and processed input television content 520 as output television content 522 (representing one of the types of audio/video content 320 of FIG. 3) to the television 304. To that end, the television content output interface 504 may encode the selected television content in accordance with one or more television output formats. For example, the television content output interface 504 may format the content for one or more of a composite or component video connection with associated audio connection, a modulated RF connection, an HDMI connection, or any other format compatible with the television 304 and/or audio receiver 305.

Continuing with FIG. 5, the communication interface 506 is configured to receive the message 312 from the telephone 306 receiving the incoming call request 310. As noted above, the message 312 may include none, any, or all of an identification (such as a phone number) for each of the telephone 306 receiving the incoming call request 310 and of the telephone 308 initiating the call request 310. Other information, such as the time of the call request 310, may also be included in the message 312 in further implementations. The communication interface 506 may employ any of a number of communication technologies to receive the discussion message 312, including both wired and wireless varieties. For example, the communication interface 506 may be an Ethernet, Wi-Fi, Bluetooth®, or HomePlug® interface for communicatively coupling with the telephone 306.

To allow a user of the set-top box 301 to control the selection of the input television content 520, as well as perform other operations, the user interface 508 may facilitate the entry of commands by way of user input 524. In many examples, the user interface 508 may be a remote control interface configured to receive such input 524 by way of infrared (IR), radio frequency (RF), acoustic, or other wireless signal technologies. To facilitate such information entry, the set-top box 301 may provide a menu system presented to the user via the television 304. In some implementations, the user interface 508 may also include any of a keyboard, mouse, and/or other user input device.

The control circuitry 512 is configured to control and/or access other components of the set-top box 301, including, but not limited to, the television content input interface 502, the television content output interface 504, the communication interface 506, and the user interface 508. As with the telephone 306, the control circuitry 512 may include one or more processors, such as a microprocessor, microcontroller, or DSP, configured to execute instructions directing the processor to perform the functions discussed more fully hereinafter. The control circuitry 512 may also include memory or data storage adapted to contain such instructions, or may employ the data storage 510 for such a purpose. The memory may also include data to aid the control circuitry 512 in performing the tasks more particularly described below. In another implementation, the control circuitry 512 may be strictly hardware-based logic, or may include a combination of hardware, firmware, and/or software elements.

In addition to controlling the operation of the set-top box 301 under the guidance of the user, such as to select a portion of the input television content 520 as the selected television content 522 for presentation on the television 304 and/or the audio receiver 305, the control circuitry 512 receives the message 312 from the telephone 306 receiving the incoming call request 310 via the communication interface 506. In response to receiving the message 312, the control circuitry 512 causes the audio 314A generated by the television 304 and/or the audio 314B produced by the audio receiver 305 to be at least reduced, and possibly eliminated, for at least a short period of time.

In one example, the control circuitry 512 may reduce the volume by lowering the audio level of the outgoing audio portion of the selected television content 522, such as by controlling the television content output interface 504 to perform the reduction. Similarly, the control circuitry 512 may completely mute the audio portion of the selected television content 522 in a similar manner via the television content output interface 504. In either case, the resulting volume of the audio 314 generated by the television 304 and/or the audio receiver 305 is reduced accordingly.

In another implementation, the control circuitry 512 may pause the presentation or playback of the selected television content 522, thereby delaying the presentation of the audio portion of the content 522 to the television 304 or audio receiver 305. For example, while the selected television content 522 is being transmitted via the television content output interface 504, the control circuitry 512 may begin buffering the selected content 522 in a content buffer 518 of the data storage 510 while preventing any further content 522 from being transmitted to the television 304. In other words, the control circuitry 512 implements a digital video recorder (DVR) pause function, thus effectively muting the audio portion of the selected television content 522.

In one embodiment, after the audio portion of the selected content 522 is reduced or eliminated, the control circuitry 512 may await user input 524 via the user interface 508 to resume the normal audio volume level or playback of the content 522. For example, once the user has determined whether or not to answer the incoming call at the telephone 306, including possibly answering, and engaging in, the call from the requested telephone 308, the user may then increase the audio volume level, or resume playback, of the content 522 by way of a "play" or "mute" button of a remote control device. In some configurations, any user input 524 may cause the playback resumption or volume increase. In another example, the resumption of normal audio levels may occur after some predetermined time period from the reception of the message 312.

In the case the data storage 510 provides typical DVR functionality, the selected television content 522 may be derived from previously recorded material residing in the content buffer 518. As result, the playback pausing or volume reduction of the content 522 from the buffer 518 may be controlled in the same manner described above with respect to the selected input television content 520 being streamed as the selected television content 522 to the television 304.

In another implementation, instead of performing the audio volume reduction within the set-top box 301, the control circuitry 512 may transmit a command 526 to the television 304 and/or the audio receiver 305 via the control interface 514 to direct the device 304, 305 to reduce the audio 314 volume level of the selected television content 522 prior to being presented to the user in response to receiving the message 312. For example, the control circuitry 512 may generate one or more "volume down" commands, or present a "mute" command, to either or both of the television 304 and the audio receiver 305.

The control interface 514 of the set-top box 301 may transmit the command 526 using any communication technology implemented by the television 304 and/or the audio receiver 305 to receive the command 526. In an example in which the selected television content 522 is transmitted using an HDMI connection, the set-top box 301 may utilize the Consumer Electronics Control (CEC) bus incorporated within the HDMI to transmit the command 526, presuming the television 304 possesses the capability to accept and process the commands 526 when transmitted using the CEC bus. Other wired connections, whether or not associated with the television content output interface 504 coupling the set-top box 301 with the television 304 and/or the audio receiver 305, may be employed to carry the commands 526 in other embodiments, including but not limited to Ethernet, Universal Serial Bus (USB), and so forth.

In another implementation, the set-top box 301 may employ a wireless remote control interface as the control interface 514 to issue the command 526 via a remote control input interface of the television 304. More specifically, the control interface 514 may operate as a wireless transmitter (such as an IR or RF transmitter) of remote control commands 526 that may be received by way of the television 304 remote control input interface. With respect to IR transmission, the commands 526 may be issued by way of an IR diode coupled with the set-top box 301 via a wire or "tether" to allow the diode to be positioned within close proximity of the remote control receiving circuitry of the television 304 and/or the audio receiver 305. In another example, the control interface 514 may be capable of transmitting IR remote control commands at a relatively high power, to allow the IR command signal to reflect off of nearby walls, ceiling, or furniture to reduce the need for direct line-of-sight between the control interface 514 of the set-top box 301 and the remote control interface of the television 304. In other implementations, other wireless communication technologies, such as Bluetooth® and Wi-Fi, are contemplated.

By issuing one or more commands 526 to reduce the audio 314 volume at either or both of the television 304 and the audio receiver 305, the set-top box 301 is able to cause the volume reduction regardless of whether the television 304 and the audio receiver 305 are presenting to the user the selected television content 522 transmitted from the set-top box 301, or if the television 304 and the audio receiver 305 are presenting audio/video content 320 from another source, such as the DVD player 302 of FIG. 3. If, instead, the control circuitry 301 causes the audio 314 volume reduction exclusively at the television content output interface 504 or another component internal to the set-top box 301, any audio 314 generated via content 320 sourced by the DVD player 302 will continue to be presented via the television 304 and the audio receiver 305 at its original volume level.

In some embodiments, the user of the set-top box 301 may only want the audio 314 volume of the content 522 to be reduced if the telephone number for the telephone 308 issuing the incoming call request 310 is one of several predetermined telephone numbers recognized by the user. For example, while viewing or listening to the selected television content 522 being presented by the television 304 and/or the audio receiver 305, the user may only want to answer calls from family members, personal friends, and the like, opting to allow other calls received during that time to be directed to voicemail, or to be ignored entirely. In that case, the user may store a set of predetermined telephone numbers in a phone identification database 516 within the data storage 510 by way of the user interface 508. Under these circumstances, the message 312 includes the phone number or other identification of the telephone 308 issuing the incoming call request 310. Upon receiving the message 312 via the communication interface 506, the control circuitry 512 compares the phone number in the message 312 with the phone numbers stored in the phone identification database 516. If the identification in the message 312 is not found in the database 516, the control circuitry 512 may then ignore the incoming message 312, resulting in the preexisting audio 314 levels being maintained. Oppositely, if the number within the message 312 is found within the database 516, the control circuitry 512 may then act to reduce the volume of the audio 314 produced by either or both of the television 304 and the audio receiver 305 according to any of the methods or procedures described above.

In addition to the phone identification database 516, the user of the set-top box 301 may set one or more configuration parameters 517 stored in the data storage 510 to direct the control circuitry 512 to respond to the message 312 as the user desires. The configuration parameters 517 may include data indicating whether the control circuitry 512 reduces the volume of the audio 314 by sending a command to the television 304 and/or the audio receiver 305, or performs the audio reduction on the selected television content 522 at the television content output interface 504. Further, the configuration parameters 517 may determine whether the audio 314 volume is reduced or muted, or whether the content 522 is paused, as discussed earlier. Other configuration information not specifically discussed herein may also be included in the configuration parameters 517 in other embodiments. In one example, the user may set the configuration parameters 517 via a graphical menu displayed to the user by way of the television 304.

At least some embodiments as described herein thus automatically reduce the audio volume generated by one or more electronic devices in an entertainment system when an audio communication device of the user receives a request to engage in an audio communication, such as a phone call. Thus, the user is likely to recognize such an incoming communication even when the audio volume generated by a television, audio receiver, or the like would otherwise mask the ringing of a telephone or similar audible notification of an incoming communication request. Further, in the case of a set-top box initiating the audio volume reduction by issuing commands to the audio-generating components of the entertainment system, the audio may be reduced for additional sources of the media content involved, such as a DVD player, video cassette recorder (VCR), and standalone DVR.

While several embodiments of the invention have been discussed herein, other implementations encompassed by the scope of the invention are possible. For example, while various embodiments have been described largely within the context of landline and cellular telephones, other types of audio communication devices, such as satellite telephones, amateur radios, weather advisory radios, Family Radio Service (FRS) radios, and the like, may be addressed as described above. Further, while the initiation of the volume reduction functionality is described primarily as occurring within a television set-top box, other electronic devices, such as DVD players, VCRs, DVRs, televisions, audio receivers, and the like, may incorporate various aspects of the functionality described above to similar effect. In addition, aspects of one embodiment disclosed herein may be combined with those of alternative embodiments to create further implementations of the present invention. Therefore, while the present invention has been described in the context of specific embodiments, such descriptions are provided for illustration and not limitation. Accordingly, the proper scope of the present invention is delimited only by the following claims and their equivalents.

What is claimed is:

1. A method of facilitating use of an audio communication device in the presence of an electronic device capable of generating sound, the method comprising: receiving a message from the audio communication device at a set-top box, wherein the message indicates the audio communication device has received a request for an audio communication from a second audio communication device; and wherein the message comprises an identification of the second audio communication device: in response to the message, comparing the identification of the second audio communication device with a database comprising a plurality of audio device identifications; generating a command configured to reduce an audio volume of the electronic device when the database includes the identification of the second audio communication device; inhibiting the reduction of the audio volume of the electronic device when the database does not include the identification of the second audio communication device; communicating the command configured to reduce the audio volume of the electronic device from the set-top box to a remote control; and communicating a wireless command from the remote control to the electronic device, wherein the wireless command corresponds to the command configured to reduce the audio volume of the electronic device.

2. The method of claim 1, wherein receiving the message comprises:

receiving the message at a second electronic device communicatively coupled with the first electronic device; and the method further comprising:

transmitting the command from the second electronic device to the first electronic device to reduce the audio volume of the first electronic device, wherein the audio volume of the first electronic device is reduced.

3. The method of claim 2, wherein:

transmitting the command comprises transmitting the command to a wireless remote control interface of the first electronic device.

4. The method of claim 1, further comprising:

muting the electronic device.

5. The method of claim 1, further comprising:

pausing a playback function of the electronic device.

6. The method of claim 1, wherein: the first audio communication device comprises a telephone; and the identification of the second audio communication device comprises a telephone number.

7. An electronic system, comprising: a media content output interface in a set-top box that is configured to transmit media content for presentation to a user via an electronic device capable of generating sound or audio; a communication interface in the set-top box that is configured to receive a message from an audio communication device, wherein the message indicates an audio communication is being requested at the audio communication device by a second audio communication device; data storage configured to store a plurality of identifications of audio communication devices; control circuitry in the set-top box that is configured to, in response to the message, generate a command that is configured to reduce an audio volume associated with the media content as presented to the user; and a remote control that is configured to receive the command from the set-top box, and is further configured to communicate a wireless command to the electronic device, wherein the wireless command corresponds to the command configured to reduce the audio volume of the electronic device, wherein the message comprises an identification of the second audio communication device; and wherein the control circuitry is configured to, if the data storage does not include the identification of the second audio communication device, prevent the reduction of the audio volume associated with the media content as presented to the user.

8. The electronic system of claim 7, wherein:

to reduce the audio volume associated with the media content, the control circuitry is configured to reduce the audio volume associated with the media content before the media content is transmitted via the media content output interface.

9. The electronic system of claim 7, wherein:

to reduce the audio volume associated with the media content, the control circuitry is configured to mute the audio volume associated with the media content before the media content is transmitted via the media content output interface.

10. The electronic system of claim 7, wherein:

to reduce the audio volume associated with the media content, the control circuitry is configured to pause the media content before the media content is transmitted via the media content output interface.

11. The electronic system of claim 7, wherein:

a second electronic device is coupled with the media content output interface and is configured to present the media content to the user; and to reduce the audio volume associated with the media content, the control circuitry is configured to transmit a command via the media content output interface to the second electronic device to reduce the audio volume associated with the second electronic device.

12. The electronic system of claim 7, further comprising:

a remote control output interface;

wherein a second electronic device is coupled with the media content output interface and is configured to present the media content to the user; and wherein, to reduce the audio volume associated with the media content, the control circuitry is configured to transmit a command via the remote control output interface to a remote control input interface of the second electronic device to reduce the audio volume associated with the second electronic device.

* * * * *